United States Patent [19]

Bussman et al.

[11] 3,786,973

[45] Jan. 22, 1974

[54] METHOD AND APPARATUS FOR BREAKING SEMICONDUCTOR WAFERS

[75] Inventors: Dale R. Bussman, Dayton; Frederick K. Bell, Centerville; David E. Filsinger, Dayton, all of Ohio

[73] Assignee: The National Cash Register Company, Dayton, Ohio

[22] Filed: Mar. 28, 1972

[21] Appl. No.: 238,825

[52] U.S. Cl. .................................... 225/2, 225/96.5
[51] Int. Cl. .................................................. B26f 3/00
[58] Field of Search. 225/2, 96.5; 83/339, 509, 510, 83/284; 241/228; 29/413

[56] References Cited

UNITED STATES PATENTS

| | | | |
|---|---|---|---|
| 743,014 | 11/1903 | Mouck | 241/228 X |
| 989,819 | 4/1911 | Smythe | 241/228 X |
| 1,475,693 | 11/1923 | Ferencz | 241/228 X |
| 2,293,439 | 8/1942 | Lloyd | 241/228 X |
| 3,507,426 | 4/1970 | Bielen et al. | 225/96.5 X |

*Primary Examiner*—Frank T. Yost
*Attorney, Agent, or Firm*—J. T. Cavender; Wilbert Hawk, Jr.; George J. Muckenthaler

[57] ABSTRACT

The semiconductor wafers, containing a plurality of electrical circuits, are scribed along critical lines so as to provide weakened portions for ease of breaking the wafers along such lines. The wafer is placed between two cylindrical surfaces of prescribed radii, one larger than the other, and a predetermined load is impressed to deform the wafer and to accurately control the stresses throughout the wafer for breaking the wafer into dice containing individual circuits.

8 Claims, 9 Drawing Figures

METHOD AND APPARATUS FOR BREAKING SEMICONDUCTOR WAFERS

BACKGROUND OF THE INVENTION

In the field of semiconductor devices, it is desirable to provide minute chips having electrical circuitry for use in integrated circuit or microcircuit devices. The semi-conductor wafer containing the electrical circuitry is scribed on one side thereof and then is "worked" to obtain a plurality of individual die units or dice, which units are then in a size and shape to be assembled into compact circuitry.

After scribing, the wafers (usually 2–3 inches in diameter) to be "worked" are placed into a packet or otherwise retained between two sheets of film or the like, so as not to lose the particular arrangement, and then are acted upon by a roller or other movable device cooperating with a resilient pad or the like to break the wafer along the scribe lines. The roller is moved in a first instance to break the wafer on the scribe lines running in one direction and then the wafer is turned 90° to break the wafer on scribe lines running perpendicular to those of the one direction.

Representative of the prior art in the dicing of semiconductor wafers is U.S. Pat. No. 2,970,730 to F. W. Schwarz wherein a sheet of wafers is placed on an arbor and the ridges or ribs of the arbor break the wafer along the scribe lines.

U.S. Pat. No. 3,040,489 to H. Da Costa shows semiconductor dicing wherein a roller moves across a package of wafers placed on a resilient pad.

Another method for dicing semiconductor material is shown and described in U.S. Pat. No. 3,182,873 to B. F. Kalvelage and A. W. Coe wherein a flexible diaphragm is forced down on a wafer and over a curved member.

A. Meyer and W. Steger in U.S. Pat. No. 3,206,088 use a deformable foil over the wafer and place the wafer on a soft pad and then move a roller across to break the wafer.

U.S. Pat. No. 3,396,452 to K. Sato and Y. Nakamura utilizes a slightly different concept of two rollers cooperating with the wafer package between them, one of the rollers being of a hard resilient material and the other being of a soft resilient material.

Another showing of the prior art is U.S. Pat. No. 3,493,155 to I. Litant and A. J. Scapicchio wherein a flexible diaphragm is forced against the wafer and down over a curved surface.

J. M. Bielen and G. V. Morris in U.S. Pat. No. 3,507,426 use compressed air to force the wafer sandwich downwardly to conform to a concave surface.

Another method of severing a wafer is shown in U.S. Pat. No. 3,537,169 to J. Eigeman and H. A. van de Pas wherein the wafer is electrostatically held to a foil and placed on a resilient layer to be worked by a roller.

And finally U.S. Pat. No. 3,559,855 to J. R. Barnett and R. W. Brown shows a wafer in a bag or packet placed on a pad of resilient material and acted on by a compressive roll member.

SUMMARY OF THE INVENTION

The present invention relates to semiconductor wafers and more particularly to a method and apparatus for breaking the wafer into individual die units for use in integrated circuit or microcircuit devices. The invention involves the concept of utilizing two cylindrical surfaces of prescribed radii between which the wafer is placed and then impressing a predetermined load while the load is being moved across the wafer.

As is generally the procedure, the scribed wafer is placed in a packet or held between two layers of film so as to contain the die units or dice in the same arrangement after the breaking of the wafer as was the pattern in the unbroken condition. While one cylindrical surface in the form of a roller has been used with a metal sheet placed on resilient material (the wafer being between the roller and the metal sheet), wherein to obtain the desired breakage of the wafer along the scribed lines, the present invention is an improvement thereover and has advantages and features which are considered important in the advancement of the art.

A cylindrical or like-shaped surface is provided wherein its radius of curvature has been predetermined in accordance with certain parameters, one of which is the measure of the scribed lines on the semiconductor wafer. The wafer, while being contained in its bag or packet, is placed along the cylindrical surface and a second cylindrical-surfaced roller is rolled inside the first surface and across the wafer, thus causing the wafer to be locally deformed to such an extent that failure occurs along the scribe lines. On the first pass of the roller across the wafer, one set of the scribe lines are positioned parallel to the axes of both cylindrical surfaces, after which the wafer is rotated 90° and a second pass is made by the roller to complete the breaking along the scribe lines and thus provide the individual die units. Another parameter of design is the pressure imposed on the wafer as determined by the weight of the roller or by other external loading. Additional parameters in the design are the radii of the curved surfaces which are calculated with regard to the size of the wafer, the measure of the scribe lines thereon, and the pressure on the wafer as the roller is moved thereacross.

In line with the above discussion, the principal object of the present invention is to provide apparatus for breaking semiconductor wafers into individual die units wherein the yield is substantially increased.

A further object of the present invention is to provide an apparatus for breaking such semiconductor wafers wherein the breaking operation is insensitive to the operator.

Another object of the present invention is to provide an apparatus for breaking wafers along scribed lines wherein the wafer is rigidly controlled during the breaking operation.

An additional object of the present invention is to provide apparatus for breaking wafers along scribed lines wherein the breaks are sharp and clean and the surfaces of the individual die units are not disturbed during the breaking operation.

Additional advantages and features of the present invention will become apparent and fully understood from a reading of the following description taken together with the annexed drawings, in which.

Figure 1:
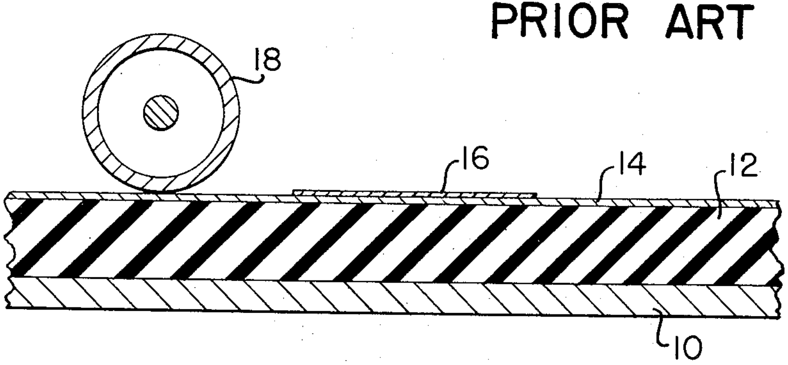
FIG. 1 PRIOR ART
FIG. 1 is a view showing apparatus which is representative of the prior art.

Referring to FIG. 1, which illustrates typical prior art devices and which concept has heretofore been used by applicants, a base 10 supports a pad of resilient material 12, there being a metal sheet 14 thereon and supporting a semiconductor wafer 16. A roller 18 is moved across the wafer in one direction and then in a direction perpendicular thereto to break the wafer into the desired individual die units. Suffice it to say that, as mentioned above, this apparatus has certain disadvantages and the present invention is an improvement thereover.

Figure 2:
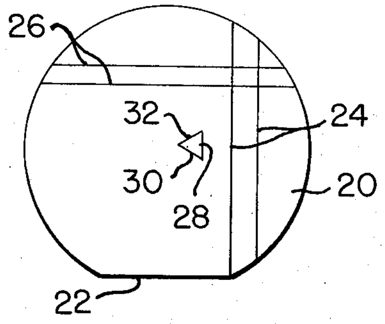
FIG. 2 is a view of a semiconductor wafer showing certain of the scribe lines and certain of the cleavage planes.

The basic concept of the present invention is to develop stresses in the semiconductor by deforming it between two cylindrical surfaces of prescribed radii and with a predetermined load. The important parameters considered in developing this concept are the two radii, the load imposed, and the direction of the first roll of the load, Referring now to FIG. 2 which shows a semiconductor wafer 20 with a flat 22 along one side thereof, a set of scribe lines 24 running in one direction and a set of scribe lines 26 running in a perpendicular direction thereto are made on one surface of the wafer, it being understood that these sets of lines are typical of lines scribed across the entire wafer in both directions. Also shown is a natural cleavage plane 28 parallel to scribe lines 24 and additionally shown are planes 30 and 32 at approximately 60° from plane 28. These natural cleavage planes are inherent characteristics of the material used for the wafer, e.g., silicon or germanium. The flat 22 of the wafer is for orientation purposes in the handling thereof, as will be further described.

Figure 3:
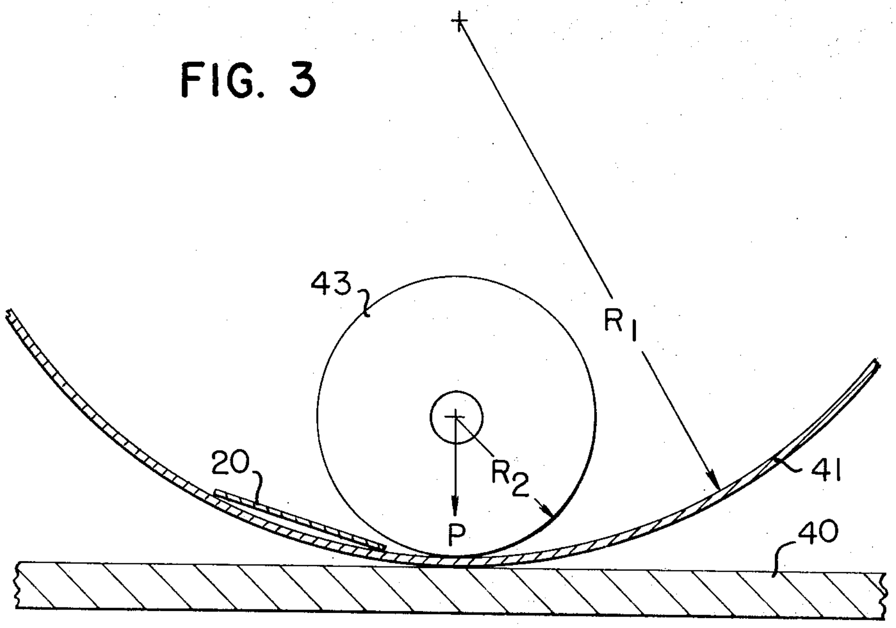
FIG. 3 is a view of the apparatus for semiconductor wafer breaking in accordance with the present invention.

In FIG. 3 is illustrated the preferred embodiment of the present invention wherein a flat base 40 supports the various elements, these being a non-resilient material cylindrical member 41 having a radius $R_1$, a non-resilient material cylindrical member 43 having a radius $R_2$ and imposing a force or weight P in the downward direction, and the wafer 20 positioned on the surface of member 41 to be acted upon by the member 43. Although not shown, the cylindrical member 43 has a length equal to or greater than the diameter of the wafer 20.

Figure 5:
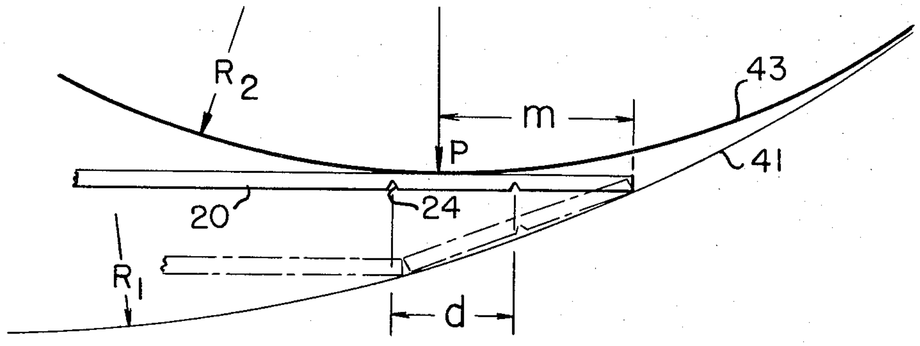
FIG. 5 is a further enlarged view of a portion of the apparatus shown in FIG. 4.
Figure 4:
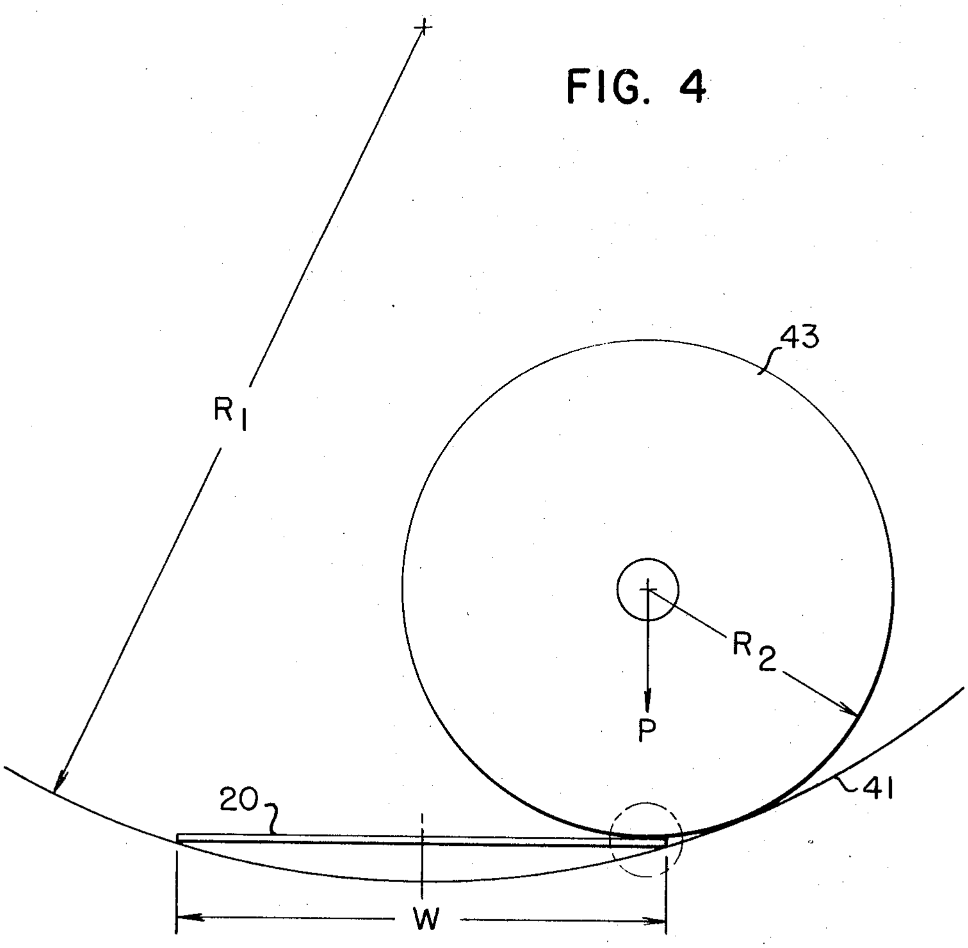
FIG. 4 is an enlarged view of a portion of the apparatus shown in FIG. 3.

An enlarged illustration of the positions of the various parts is shown in FIG. 4 wherein the roller member 43 is located in a start-rolling condition with the member 43 in contact with the surface of member 41 and also in contact with an edge portion of the wafer 20, which wafer is contained between the surfaces of the two members 41 and 43. FIG. 5 shows a further enlargement of the right hand end of the wafer 20 with scribe lines 24 running along the underside of the wafer and ready to be acted upon by the roller member 43. The distance between scribe lines is depicted at d for a wafer having an unbroken section of length w, FIG. 4. Although not shown, the scribed wafer 20 is contained within a vacuum-sealed packet or between thin sheets of film to maintain the individual units in position after the breaking of the wafer. This is a required and common practice in the semiconductor art.

Figure 6:
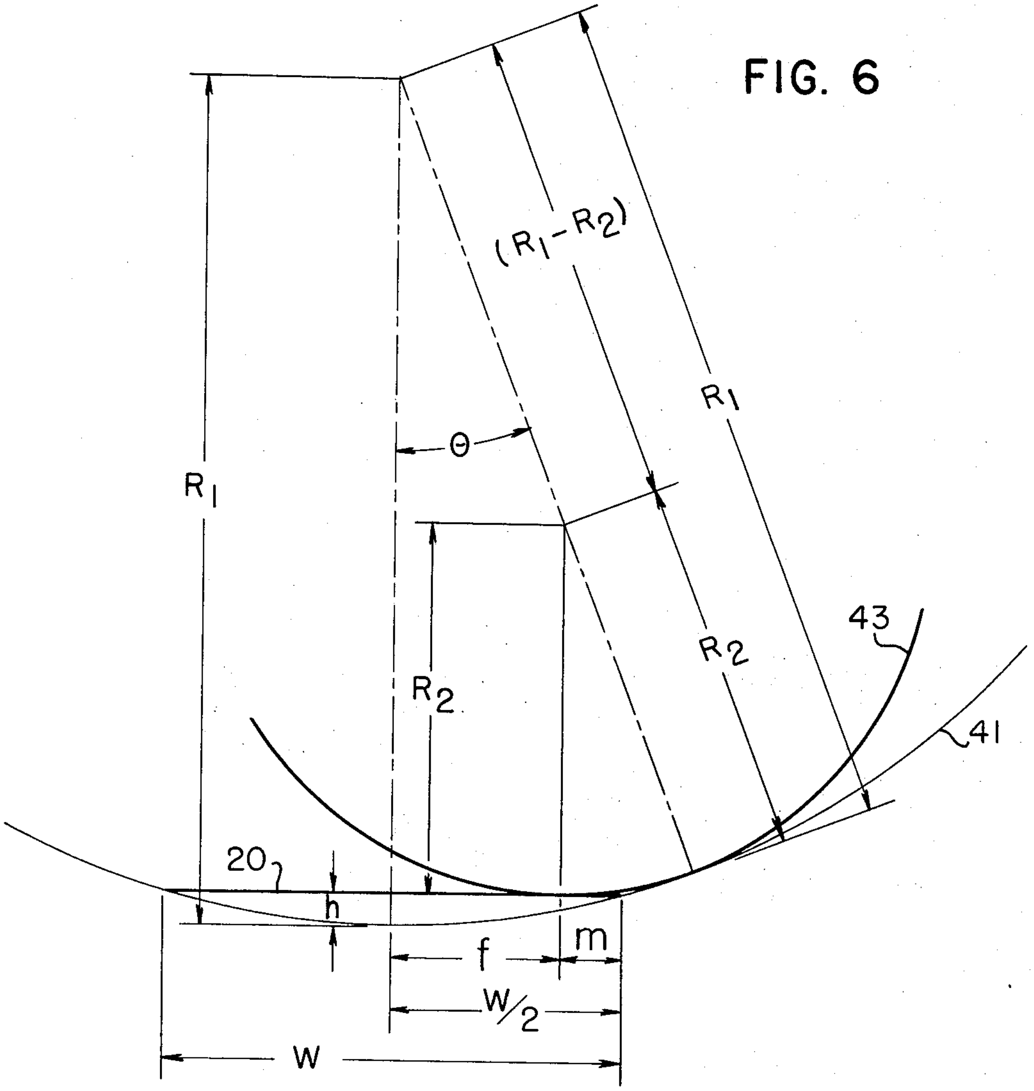
FIG. 6 is a view showing certain of the parameters for determining proper design of the apparatus.
Figure 7:
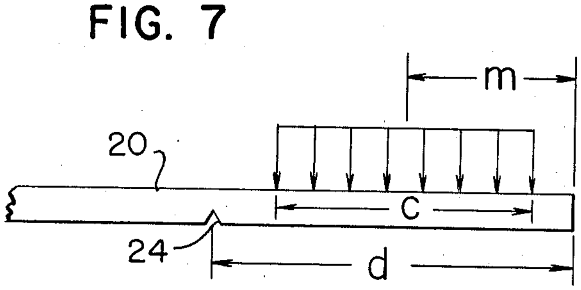
FIG. 7 is a view showing forces acting on the wafer during the breaking operation.
Figure 8:
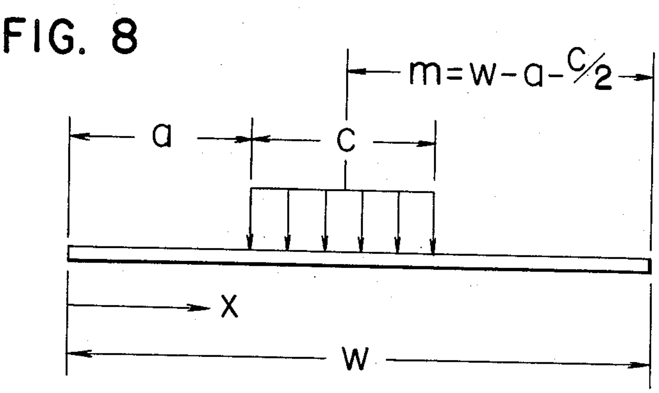
FIG. 8 is a view showing forces and distances for determining the pressure required to break the wafer along the scribe lines.

FIGS. 6, 7, and 8 illustrate a representation of the various elements used in the derivation of the correct parameters for successful and optimum design of the apparatus. These will be more fully explained in regard to actual dimensions for the equations used herein.

As mentioned above, the critical parameters in the design of this device are the radius $R_1$ of cylindrical member 41, the force or weight P acting to deform the wafer 20 as member 43 rolls over the wafer, and the radius $R_2$ of member 43. In determining the proper values of these parameters, it should be recognized that there are different sequences in which the wafers can be broken along the scribe lines. One possible sequence is to break the wafer on successive scribe lines as the roller 43 rolls over the wafer. Other possible sequences are those in which breakage does not occur on successive scribe lines but follows a breaking sequence such as 2, 1, 4, 3, 6. 5, etc. wherein the second scribe line from an edge of the wafer is broken prior to breaking the line nearest the edge, the fourth line is broken prior to breaking along the third line, etc. Likewise, a possible sequence of breaking could be 3, 1, 2, 6, 4, 5, 9, 7, 8, etc. where the third scribe line is broken, then the first and subsequently the second in such a pattern. The sequence of breaking is a function primarily of the radius $R_1$ of member 41 and the radius $R_2$ of member 43, and the force or weight P likewise is a function of the sequence of breaking.

As can be explained from FIGS. 4 and 5, which shows the roller 43 rolling onto the edge of the wafer 20, and depending upon the values of the radii $R_1$, $R_2$ of the members 41, 43 and the unbroken length w of the wafer, or the length across the wafer if not circular, the point of application of the force or load P will be at different distances from the supported end of the wafer. If the distance d between scribe lines 24 is large, then a certain $R_1$, $R_2$ combination will result in a break at the first scribe line, but if *d* is small, the first break may occur at the second or the third scribe line. Assuming that the distance *d* is small and that the first break has occurred, the wafer then takes a position along the surface of member 41, as shown in the dotted line location in FIG. 5, and as the roller 43′continues to roll, the force P exerted is to the right of the first break and a break is made along a scribe line adjacent the first break. If the portion to the right of the first break contains only one scribe line, then a break will occur at that line. The design of the parameters must guarantee that the portion to the right will be broken only along that line as the member rolls over it. If, however, this portion contains two or more sections as described by two or more scribe lines, then the design must likewise guarantee that breakage will occur on the remaining scribe lines only in the proper sequence.

The method for determining $R_1$, $R_2$ and P is described as follows: As just mentioned, after breakage occurs at a scribe line, the portion of the wafer 20 to the right of the line will again be rolled over by member 43. Since this broken section is relatively small and the pressure on this section is distributed somewhat due to the plastic bag containing the wafer, the tendency is for this portion to be deformed to the value of $R_1$ provided that the load P is adequate. Therefore, the radius $R_1$ is selected so that the resulting stresses on the individual dies or strips of dies will not cause other failures, particularly on the natural cleavage planes not parallel to a scribe line.

The minimum value of $R_1$ is established by the stresses along cleavage planes 30 and 32 where breaking is not to occur. Referring back to FIG. 2, the wafer 20 is scribed in a manner parallel and perpendicular to the flat 22 with the natural cleavage planes shown by the triangle. It is easily shown that the first roll by roller 43 should be made so that the axes of the roller and of the member 41 are perpendicular to the flat 22 wherein the first roll made in this manner reduces the possibility of fractures occurring along the cleavage planes 30, 32. This, of course, is desirable because failures along these planes during the first roll may propagate across the wafer on those planes and cause considerable loss in yield. The reason why fracture is less likely to occur along these cleavage planes is that, for a given load P acting to deform the wafer 20, the stress along planes 30 and 32 is smaller for the first roll with the axes perpendicular to the flat 22 than for the case where the axes are parallel to the flat. If a failure occurs along these planes during the second roll, the crack can only propagate one die width and the loss can be minimized.

If the first roll is made so that the axes of the cylindrical members are perpendicular to the flat 22, then the second roll, which is perpendicular in direction to that of the first roll, will cause maximum stresses on cleavage planes 30 and 32. The value of the maximum stress on these planes, from theory of elasticity, is shown by Equation 1 wherein:

$$S_{max} = 0.375\ Et/R_1$$

where E is the modulus of elasticity for the wafer, $t$ is the thickness of the wafer, and $R_1$ is the radius to which the wafer is forced to conform. Since breaking is undesirable on planes 30 and 32, the value of $R_1$ should be determined so that the maximum stress along these planes is less than the minimum stress, $S_{min}$, at which failure will occur for the wafer material. If the value of the thickness varies due to tolerances, or if different thicknesses are to be broken with the same device, the maximum thickness must be considered in calculating the minimum allowable value of $R_1$. This is shown by Equations 2 and 3 wherein the maximum stress on planes 30, 32 is equal to or less than the minimum stress on the wafer.

EQUATION 2

$$0.375\ Et_{max}/R_{1min} \leqq S_{min}$$

EQUATION 3

$$R_{1min} \geqq 0.375\ Et_{max}/S_{min}$$

For example, if $E = 28 \times 10^6$ psi, $t_{max} = 0.012$ inches, and $S_{min}$=25,000 psi, then $R_{1min} > 5.04$ inches. The above equations establish the minimum value of $R_1$ and are based on the assumption that there are no faults in the wafer 20 which would result in a lower breaking stress along the cleavage planes 30, 32 indicated, or on other cleavage planes across the wafer. After calculating the radius $R_2$ and the load P, as will be shown in the description immediately following, the stress on the cleavage planes should be recalculated using equations 9, 10, and 11, modified thusly: $S_{max}$ on the cleavage plane $= 0.75 \times 6M_{max}/bt^2$. If these equations yield a stress on the cleavage plane which exceeds the allowable stress, a larger radius $R_1$ than given by Equation 1 may be required so that the die cannot deflect sufficiently to produce a stress which exceeds the allowable stress.

In the matter of determining $R_2$, the relationships between $R_1$, $R_2$ and w, the length of the unbroken wafer, are very important because these relationships determine the failure sequency and consequently the required force acting between the radii $R_1$ and $R_2$. The governing relationships which are derived from geometric considerations, as seen in FIG. 6, are as follows:

EQUATION 4

$$m = w/2 - f = w/2 - (R_1 - R_2) \sin \theta$$

EQUATION 5

$$(R_1 - R_2) \cos \theta + R_2 + h = R_1$$

EQUATION 6

$$h = R_1 - 1/2\ \sqrt{4R_1^2 - w^2}$$

The maximum allowable distance $m$ from the edge of the wafer to the initial point of contact between the wafer and $R_2$ is not only a function of the breaking sequence desired but also a function of the load distribution characteristics as the roller 43 rolls across the wafer 20. The latter is a function primarily of the magnitude of $R_2$, and also of the thickness and physical properties of the packet or bag which contains the wafer.

The minimum radius for a breaking sequence on consecutive scribe lines is controlled by the largest section of unbroken wafer, that is, $w$ maximum. Referring to FIG. 7, $m$ is the distance from the edge of the wafer to the center of pressure of the distributed load, which is assumed to be uniform, $c$ is the width of the distributed load, and $d$ is the distance between consecutive scribe lines. Approximate values for $c$ can be determined experimentally for various combinations of bag materials, for $R_2$, for load $P$. For large values of $w$, compared with c and m, the maximum bending stress for the uniformly distributed load occurs very close to the left end of the load. Therefore, in order to obtain the maximum bending stress at the first scribe line, the following equation must be satisfied.

EQUATION 7

$$m + c/2 = d$$

Utilizing equation 7 to determine m, equations 4 to 6 can then be used to determine $R_2$, giving

EQUATION 8

$$R_2=\frac{w(d'-c/2)-(d'-c/2)^2}{2R_1-\sqrt{4R_1^2-w^2}}$$

where $d'=d$ for consecutive breaks and $d'=2d, 3d, nd$ for nonconsectuve breaks.

The third critical parameter to be determined is the force $P$ acting to locally deform the wafer 20, with the maximum force dependent on the breaking sequence. If the wafer is broken on consecutive scribe lines, the maximum force is that required to fracture the scribe line located approximately at the center of the wafer, that is, $b$ = the wafer diameter and $w=r$, the radius of the wafer. If the wafer is not broken on consecutive scribe lines, then the maximum force will be that force required to break at a scribe line in a section which contains only two strips of dies, that is, $w=2d$, see also FIG. 7. For the nonsuccessive break sequence, this section may occur at any part of the wafer and, therefore, the maximum width should be assumed. The relationships for determining the required force are as follows, in regard to FIG. 8.

EQUATION 9

$$M_{max}=P\ m/w\ (a+cm/2w)=P/w\ (w-a-c/2)\ (a+c/2)\ (l-c/2w)$$

EQUATION 10

$$a=X_{max}\ w+c^2/2-cw/w-c$$

EQUATION 11

$$S_{max}=M_{max}\ t/2I=6\ M_{max}/bt^2$$

where $M_{max}$ is the maximum bending moment, $P$ is the force equal to the load per unit width $x$ the width of the load, and $w$, $a$, $c$, and $m$ are the distances as shown in FIG. 8, $S_{max}$ is the maximum bending stress, $X_{max}$ is the location of $S_{max}$, $b$ is the length of the scribe line, and $t$ is the thickness of the wafer. The above equations can be used to determine the load P required to achieve a maximum stress so that failure will occur at the desired scribe line. The stress required is a function of the stress concentration resulting from the scribing procedure and should be determined experimentally.

Once the critical values for $R_1$, $R_2$, and P have been determined, the utilization of the device shown in FIG. 3 will yield conditions for breaking the wafers on the scribe lines. It is, of course, necessary that the basic wafer configuration not contain flaws and that the scribe tool must yield a stress concentration large enough to cause a fracture in the material with the highest breaking stress.

Figure 9:
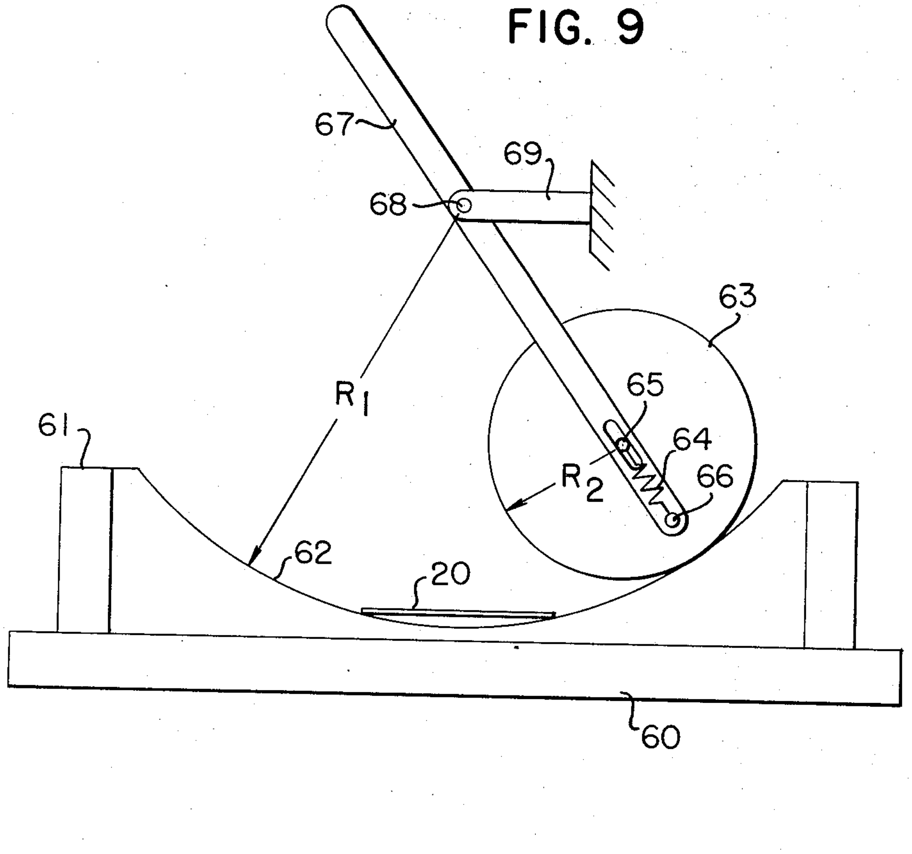
FIG. 9 is a modification of apparatus for wafer breaking in accordance with the present invention.

Referring now to FIG. 9, a modification is illustrated wherein a base 60 supports the various elements, these being a block 61 having a cylindrical surface 62 at radius $R_1$, a roller member 63 having a radius $R_2$ and imposing a weight or load P in the downward direction, with the wafer 20 positioned on the surface 62 to be acted upon by the roller 63. In this construction, the cylindrical surface 62 is fixed, as distinguished from the member 41 in FIG. 3, which may be rollable across the base 40, and the required pressure or force is provided by the weight of the roller 63 and also by force exerted from spring 64 which holds the roller against surface 62. Roller 63 is pivotable on a shaft 65 and spring 64 is connected to the shaft and to a stud 66 fixed in the end of an arm 67 pivotally supported on a pin 68 at radius $R_1$, the pin being carried on a rigid support 69. The arm 67 has a slot therein for the shaft 65 to ride therealong.

It is thus seen that herein shown and described is a method and apparatus for breaking semiconductor wafers after scribe lines have been made. The apparatus provides for increased yields by more accurately controlling the maximum stresses and reducing the possibility of fracture occurring elsewhere than along the scribe lines. The apparatus enables the accomplishment of the objects and advantages mentioned above, and while one modification of the invention has been disclosed herein, other variations may occur to those skilled in the art. It is contemplated that all such variations, not departing from the spirit and scope of the invention hereof, are to be construed in accordance with the following claims.

What is claimed is:

1. Apparatus for breaking semiconductor wafers having scribed lines thereon comprising a first member having a cylindrical radius of curvature, a
second cylindrical member having a radius of curvature proportional to the radius of said first member and rollable along the curvature of the first member, and
means including an arm and spring means connected to the arm and to the second member for exerting a predetermined force on the second member as it rolls across a semiconductor wafer placed between said first and said second curved members for breaking the wafer in sequential order along the scribe lines thereon.

2. A method of breaking a semiconductor wafer comprising the steps of
scribing intersecting lines on one surface of the wafer,
placing the wafer between two curved surface members wherein the radius of curvature of one is less than the radius of curvature of the other, and
rolling the curved surface member of lesser radius across the wafer to deform and break the wafer along said lines.

3. The method of claim 2 wherein the wafer is encased and the scribe lines are adjacent the member having the larger radius of curvature.

4. The method of claim 2 wherein the curved surface member of lesser radius includes sufficient mass to break the wafer along said lines in progressive manner.

5. The method of claim 2 including the step of providing an external force to the curved member of lesser radius for breaking the wafer along said lines in progressive manner.

6. A method of breaking a semiconductor wafer having scribed lines on one surface thereof and contained in an enclosure, comprising the steps of
placing the wafer on a concave-surfaced member, and rolling a cylindrical-surfaced member having a radius of curvature less than the radius of curvature of the concave-surfaced member across the wafer to break the wafer along the scribed lines.

7. The method of claim 10 wherein the cylindrical-surfaced member includes sufficient mass to break the wafer along said lines in progressive manner.

8. The method of claim 10 including the step of providing an external force to the cylindrical-surfaced member for breaking the wafer along said lines in progressive manner.

* * * * *

UNITED STATES PATENT OFFICE

CERTIFICATE OF CORRECTION

Patent No. 3,786,973 Dated January 22, 1974

Inventor(s) Dale R. Bussman, Frederick K. Bell & David E. Filsinger

It is certified that error appears in the above-identified patent and that said Letters Patent are hereby corrected as shown below:

Column 8, line 61, "10" should be -- 6 --.

Column 8, line 64, "10" should be -- 6 --.

Signed and sealed this 21st day of May 1974.

(SEAL)
Attest:

EDWARD M.FLETCHER,JR.
Attesting Officer

C. MARSHALL DANN
Commissioner of Patents